United States Patent
Jehlicka et al.

(10) Patent No.: US 6,710,698 B1
(45) Date of Patent: Mar. 23, 2004

(54) SEMICONDUCTOR FUSE FOR ELECTRICAL CONSUMERS

(75) Inventors: Joerg Jehlicka, Ludwigsburg (DE); Arndt Wagner, Eberdingen (DE)

(73) Assignee: Robert Bosch GmbH, Stuttgart (DE)

( * ) Notice: Subject to any disclaimer, the term of this patent is extended or adjusted under 35 U.S.C. 154(b) by 5 days.

(21) Appl. No.: 10/069,266

(22) PCT Filed: Sep. 1, 2000

(86) PCT No.: PCT/DE00/03030
§ 371 (c)(1),
(2), (4) Date: Jun. 4, 2002

(87) PCT Pub. No.: WO01/17090
PCT Pub. Date: Mar. 8, 2001

(30) Foreign Application Priority Data

Sep. 2, 1999 (DE) .......................... 199 41 699

(51) Int. Cl.[7] .......................... H02H 3/08; H02H 3/087; H01H 85/044
(52) U.S. Cl. .................. 337/221; 337/167; 337/222; 361/100; 361/101; 361/211; 361/216
(58) Field of Search .................. 337/158, 167, 337/221, 222; 361/115, 211, 216, 100, 101

(56) References Cited

U.S. PATENT DOCUMENTS

| | | | | | |
|---|---|---|---|---|---|
| 5,416,885 | A | * | 5/1995 | Sakoh | 388/838 |
| 5,629,680 | A | * | 5/1997 | Makhija | 340/664 |
| 5,945,745 | A | | 8/1999 | Macks | |
| 6,175,225 | B1 | * | 1/2001 | De Groot | 323/282 |
| 6,229,279 | B1 | * | 5/2001 | Dierker | 320/104 |
| 6,320,358 | B2 | * | 11/2001 | Miller | 323/222 |
| 6,384,489 | B1 | * | 5/2002 | Bluemel et al. | 307/10.1 |
| 6,455,951 | B1 | * | 9/2002 | Shultz et al. | 307/10.1 |
| 6,574,122 | B2 | * | 6/2003 | Morita et al. | 363/21.01 |
| 2003/0080719 | A1 | * | 5/2003 | Watanabe et al. | 323/288 |

FOREIGN PATENT DOCUMENTS

| | | | |
|---|---|---|---|
| DE | 196 45 944 A | | 5/1998 |
| JP | 08205423 A | * | 8/1996 ............. H02J/9/06 |

* cited by examiner

Primary Examiner—Anatoly Vortman
(74) Attorney, Agent, or Firm—Michael J. Striker

(57) ABSTRACT

A semiconductor fuse for electrical consumers (2) is disclosed, in which a semiconductor switch (3) is disposed between the battery (1) serving as a current- or voltage source and the consumer (2). Parallel to the semiconductor switch (3), there is a short circuit-proof bypass (4) with an integrated wakeup circuit (5), which cooperates with the semiconductor switch (3).

8 Claims, 5 Drawing Sheets

SEMICONDUCTOR FUSE FOR ELECTRICAL CONSUMERS

BACKGROUND OF THE INVENTION

The invention is based on a semiconductor fuse for electrical consumers, in particular for electrical consumers in a vehicle electrical systems.

Electrical consumers, for example electrical consumers in a vehicle electrical system, must be protected from overload by means of suitable fuses or fuse circuits. Fuses of this kind are designed, for example, as electronic fuses and include semiconductor switches, which react when there is an overvoltage or overcurrent. In consumers that must be constantly supplied with voltage and which also need constant fuse protection, a fuse is required, which needs only a minimal static current. For example, in order to fuse protect an electrical control unit of a motor vehicle, which unit represents an electrical consumer, a fuse is required, which constantly protects the control unit even at times when the vehicle is not operating and the entire energy supply must come from the vehicle battery. For a fuse of this kind, it is necessary that it only require a small amount of static current. It would be even better if it did not require any static voltage at all and thus no load would be placed on the vehicle battery even when the vehicle is parked for long periods of time.

It is known to supply control units in motor vehicles with the battery voltage via semiconductor switches, where these semiconductor switches not only perform the function of supplying voltage, but also provide a certain protection from overcurrent and overvoltage. A vehicle electrical system in which the control unit is supplied with voltage from the vehicle battery via a semiconductor switch has been disclosed by DE-OS 196 45 944. In this vehicle electrical system, the electrical system control unit is electrically connected to the battery with the aid of a field effect transistor. If the field effect transistor is in a conductive state, the control unit is supplied with voltage. If the field effect transistor is switched into the non-conductive state, the control unit goes into a "sleep mode" in which it only receives a very small amount of current and after a renewed triggering of the field effect transistor, can be quickly supplied with voltage again and thus switched on.

SUMMARY OF THE INVENTION

The semiconductor fuse for electrical consumers according to the invention has the advantage that the consumers to be protected, for example control units in a vehicle electrical systems, are actually protected in a practically static current-free manner in which the consumers are advantageously connected and protected by means of semiconductor switches. The advantage of semiconductor fuses in comparison to conventional fuses is that a semiconductor fuse does not have to be replaced after being tripped, but is ready for operation again right away. In addition, a semiconductor fuse offers the advantage of individual adaptation of the reaction characteristic curve. Furthermore, it is easily diagnosable and requires only a low mechanical cost. The advantages of the invention are achieved by virtue of the fact that the actual semiconductor fuse is connected in parallel with a static current-free bypass with an integrated wakeup circuit. Altogether, this produces a static current-free semiconductor fuse.

BRIEF DESCRIPTION OF THE DRAWINGS

Exemplary embodiments of the invention are shown in the drawings and will be explained in detail in the description that follows.

DESCRIPTION OF THE PREFERRED EMBODIMENTS

Figure 1:
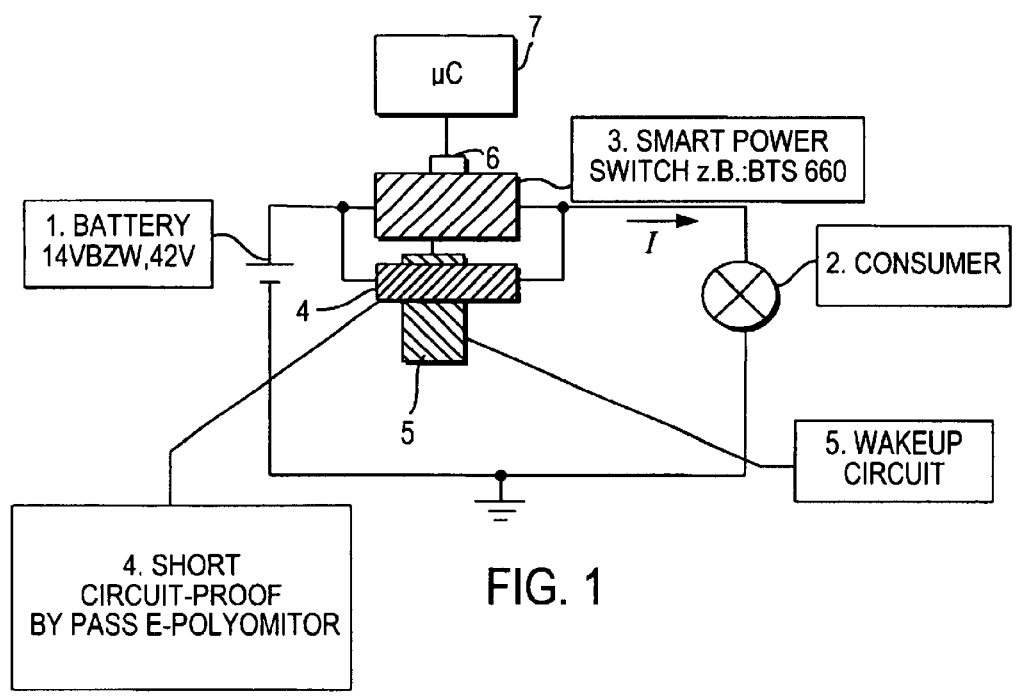
FIG. 1 shows a schematic wiring diagram of an exemplary embodiment.

FIG. 1 shows a schematic wiring diagram of an exemplary embodiment. In this case, the battery is labeled with the reference numeral 1. For example, a battery 1 of this kind is a 14 V or 42 V battery (charging voltage) of a vehicle electrical system. This battery supplies voltage to a consumer 2, for example a lamp or a control unit, etc. This voltage or current supply takes place by means of a power semiconductor 3, for example a smart power switch, a short circuit-proof bypass 4, and a wakeup circuit 5 integrated into the short circuit-proof bypass 4.

The short circuit-proof bypass 4 and the wakeup circuit 5, in cooperation with the power semiconductor 3, for example a field effect transistor, constitute the essence of the invention.

The actual fuse element for protecting the consumer 2 is constituted by the power semiconductor 3. The power semiconductor 3, or the smart power switch, which is also suited for a high-power consumer of 5 to 80 Ampere, for example, has a current measuring means (current sensor) 6. This current measuring means 6 can, for example, be evaluated by means of a control unit 7, e.g. a microcomputer, and the semiconductor 3 is switched off by the microcomputer or the control unit 7 itself in accordance with a fuse protection characteristic curve defined in the microcomputer.

If the consumer 2 itself needs no current or only needs an infinitesimally low current I, for example this is true of a control unit in "sleep mode", or if the consumer 2 is switched off, it is likewise necessary to reduce the current consumption for triggering the semiconductor 3, for example from the currently customary 2 mA to virtually 0 mA since otherwise, the required static current in the entire motor vehicle cannot be achieved. For this reason, with very low current consumption by the consumer 2, for example at a current I of less than 0.5 mA, the semiconductor 3 is switched off. The consumer 2 is then supplied with current via the short circuit-proof bypass 4 (E-PolySwitch), a current-limiting circuit, or a resistor. Since this short circuit-proof bypass 4, similar to a resistor, is only wired in series with the consumer 2 and no connection to ground is required, the bypass 4 does not consume any static current. The. bypass 4 is supplied with power only by the slight potential difference of 0 to 1.5 V, which it produces itself.

When the consumer 2 receives a higher current again, this is detected by the wakeup circuit 5 connected to the bypass 4. This wakeup circuit 5 can then "wake up" the microcomputer of the control unit 7 and switch on the semiconductor 3, for example for a definite time, at least until the microcomputer resumes control. After the microcomputer is active again, it assumes control, for example, of the semiconductor 3 and deactivates the wakeup circuit 5.

Figure 2:
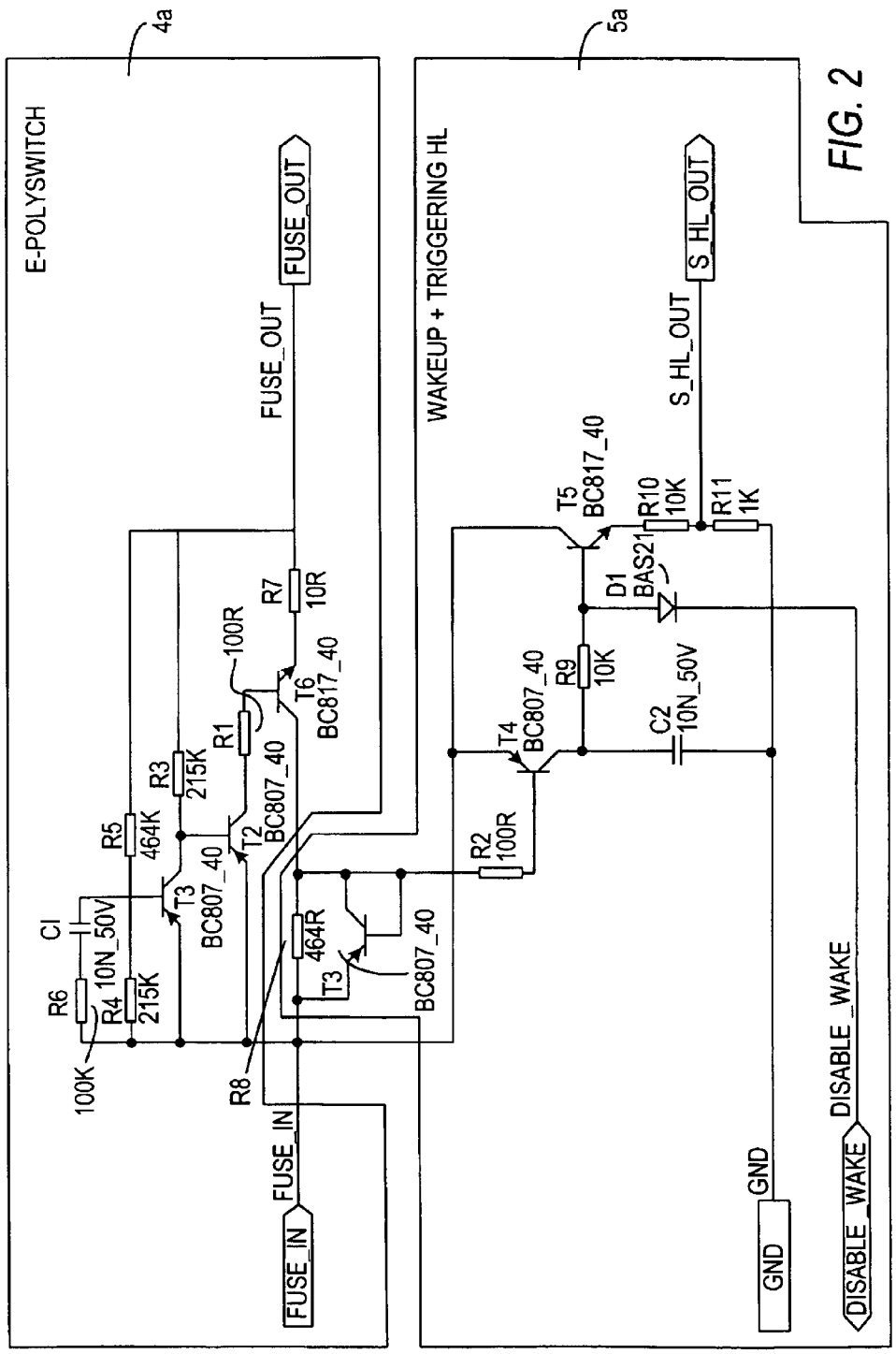
FIGS. 2 and 3 show two possible wiring embodiments for a short circuit-proof bypass and a wakeup circuit, which are each shown as a block in FIG. 1.
Figure 3:
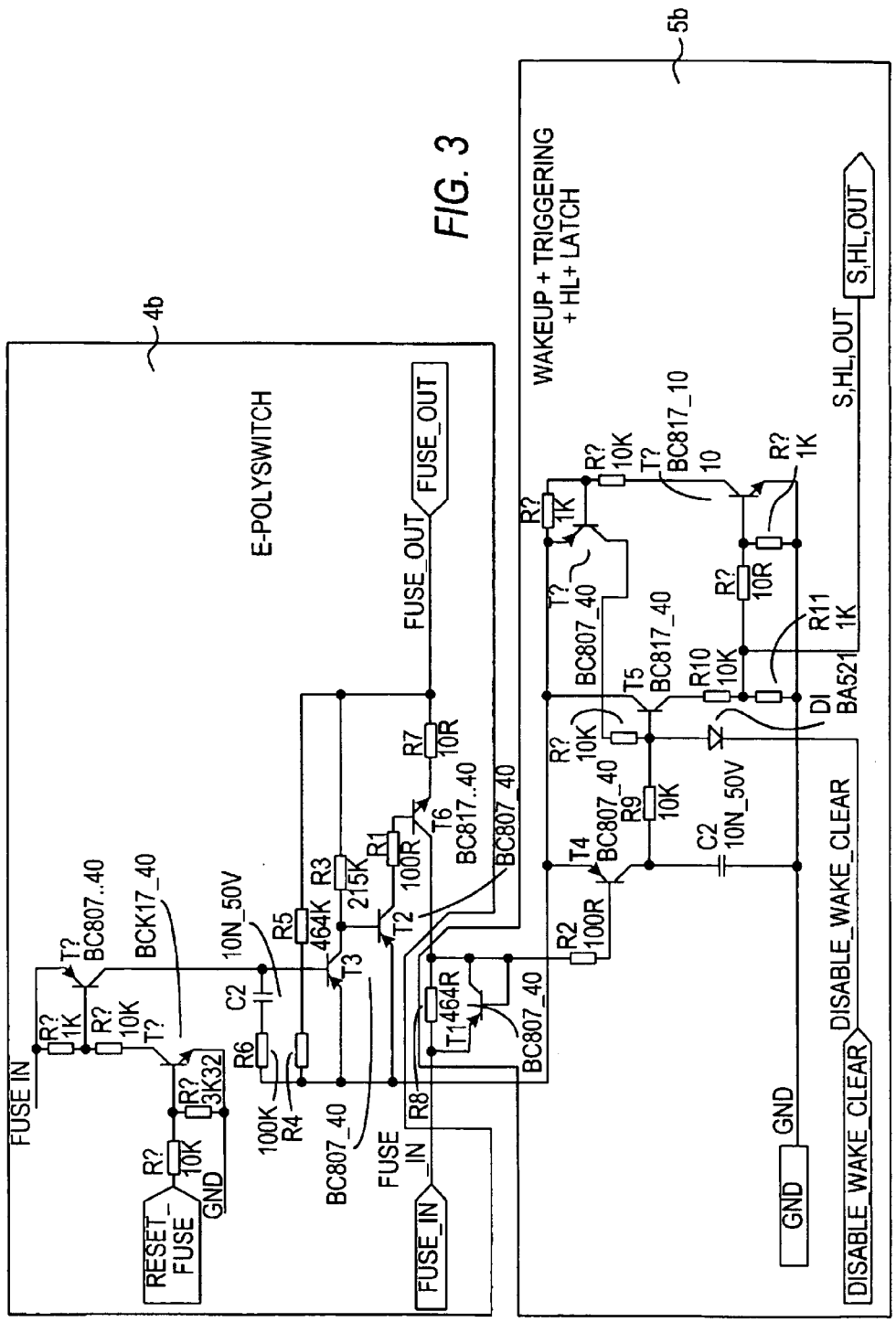

So that there are no problems in the event of a malfunction, e.g. when there is a short circuit, the bypass 4 itself is designed to be short circuit-proof. It is similar to a PolySwitch in terms of its characteristic curve and thus combines the advantage of good conductivity under normal circumstances with poor conductivity in the event of an overload, which assures it of being short circuit-proof. For example, realistic values are 80 mA during normal operation, with a maximal potential difference of approx. 1.5 V. In the event of a short circuit, with a 42 V potential difference, there is a residual current of approx. 300 A. The short circuit fuse in the bypass 4 functions nondestructively and is "self-healing". With the circuit arrangement shown in FIG. 1, it is possible to produce a static current-free fuse with semiconductors. Possible embodiments of the short circuit-proof bypass 4 with an integrated wakeup function and triggering circuit for the semiconductor switch are shown in FIGS. 2 and 3. The following advantages can be achieved with the circuits shown:

Through the dimensioning of resistors and capacitors, in particular R4 to R6 and C1, the fuse protection characteristic curve can be set within broad boundaries. For example, a particular current can also be predetermined, which is measured by the current measuring means 6 and when this current is reached, the power semiconductor (semiconductor switch 3) is switched off.

The potential difference at the "E-PolySwitch" and the residual current are low in the event of a short circuit.

The circuit does not need its own operating current and is thus static current-free.

The wakeup circuit can be easily integrated into the E-fuse without an additional potential difference.

The circuit is comprised of simple standard components and is therefore inexpensive to produce.

For the power current, an external power semiconductor 3 can be used, for example a power semiconductor with the designation BTSxxx, which is inexpensive and readily available.

Additional functions such as Disable the wakeup and triggering function as well as a Latch characteristic curve of the triggering of the semiconductor, are easily integrated; this is particularly true for a circuit arrangement according to FIG. 3.

Both circuits function with sufficient precision over a large temperature range from −40° C. to 80° C.

If the currents in the circuits to be protected remain, for example, below 500 mA, then the short circuit-proof bypass 4 (E-PolySwitch) itself can also be operated as a static current-free fuse. In this instance, the wakeup circuit and the triggering circuit for the semiconductor can be eliminated. Depending on the requirements and desired functions, additional variants can be produced with a more or less complex designs.

Figure 4:
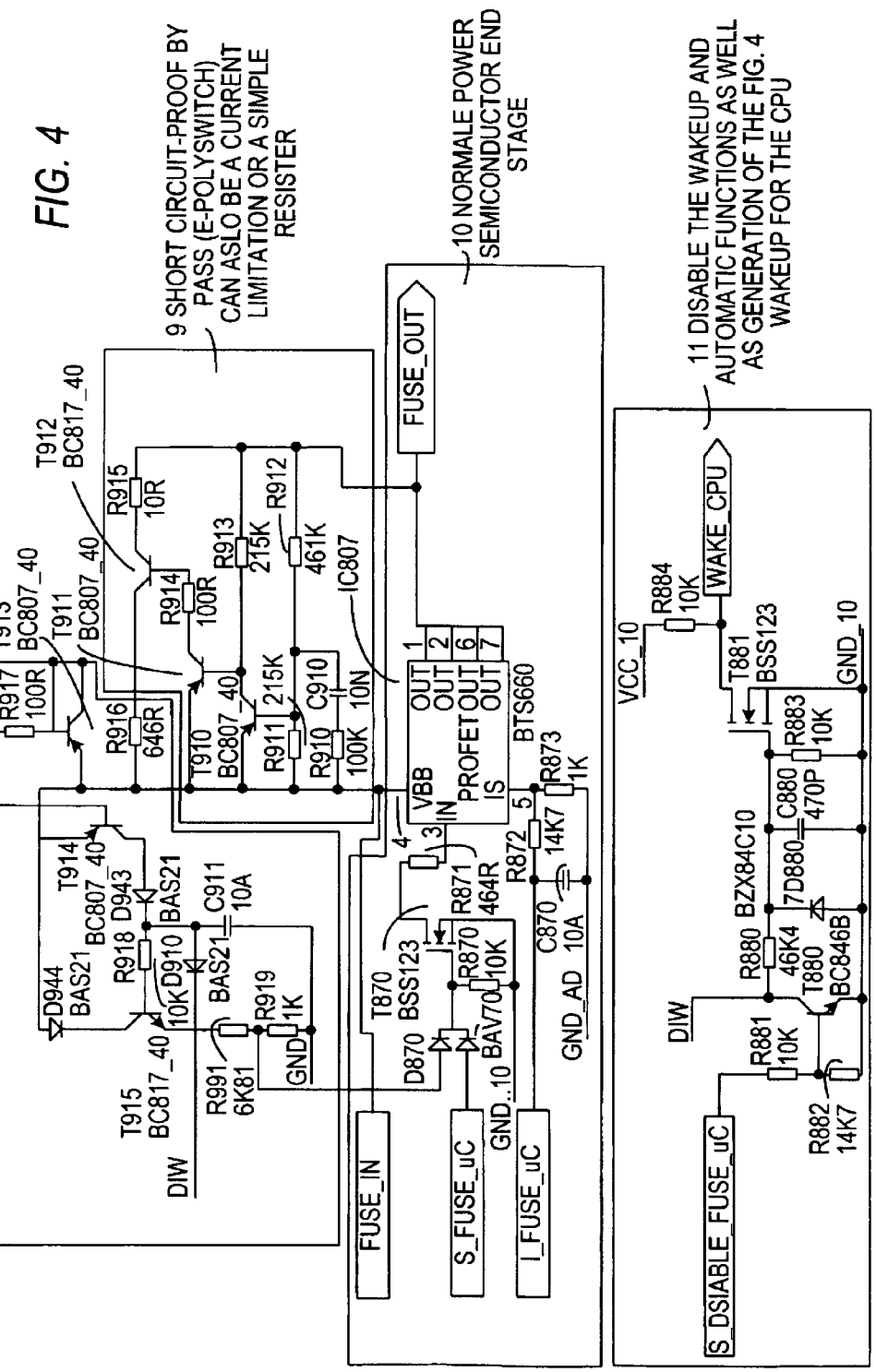
FIGS. 4 and 5 show other technical wiring embodiments of the invention.
Figure 5:
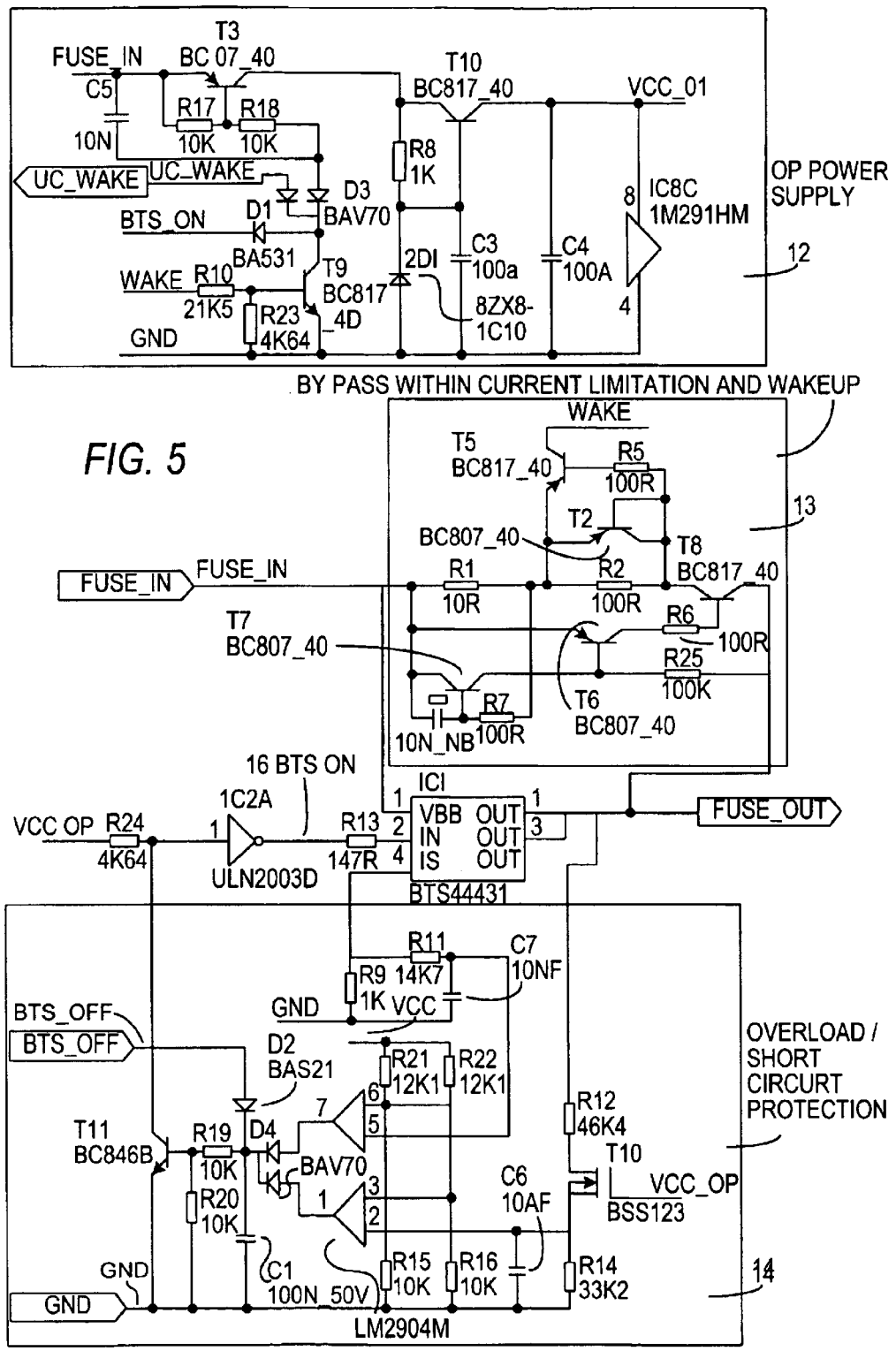

FIGS. 4 and 5 show other technical wiring embodiments of the invention. These Figs. respectively depict the cooperation of individual circuitry blocks.

FIG. 4 shows the cooperation of a wakeup circuit 8 for detection and automatic starting of the power semiconductor with the short circuit-proof bypass (E-PolySwitch) 9 and the power semiconductor end stage 10. The wakeup signal is produced in the circuit part 11.

In FIG. 5, a circuit for supplying power to an operational amplifier is labeled 12. The voltage VCC OP serves in a manner not shown in detail to supply power to the operational amplifier used. The bypass with current limitation and wakeup 13 cooperates with the circuit for overload- and short circuit protection 14.

What is claimed is:

1. A semiconductor fuse for electrical consumers, which is supplied with electrical power by a current- or voltage source, in particular a battery, having a semiconductor switch, in particular a power semiconductor, between the current- or voltage source and the consumer, by means of which the consumer can be switched on or off, characterized in that parallel to the semiconductor switch (3), there is a short circuit-proof bypass (4) that is associated with at least one wakeup circuit (5), which cooperates with the power semiconductor (3).

2. A semiconductor fuse for electrical consumers according to claim 1, characterized in that the semiconductor switch (3) and/or the short circuit-proof bypass (4) and/or the wakeup circuit (5) are controlled by an external control unit (7), in particular a microcomputer or the control unit of an internal combustion engine.

3. A semiconductor fuse for electrical consumers according to claim 1, characterized in that the short circuit-proof bypass (4) is embodied as a circuit, which requires no current when in the off state.

4. A semiconductor fuse for electrical consumers according to claim 1, characterized in that the semiconductor switch (3) has current measuring means (6), which are connected to the control unit (7), and that the control unit (7) switches off the semiconductor switch (3) if the current detected falls below or exceeds a predeterminable value.

5. A semiconductor fuse for electrical consumers, which is suppliable with electrical power by a current or a voltage source, the semiconductor fuse comprising a semiconductor switch formed as a power semiconductor adapted to be arranged between the current or voltage source and a consumer to switch on and off the consumer; a short circuit-proof bypass arranged parallel to said semiconductor switch and formed as a circuit that has good conductivity under normal circumstances and poor conductivity in an event of an overload and requires no current when in an off state; at least one wakeup circuit with which said short circuit-proof bypass is associated and which cooperates with said semiconductor switch, at least one of the elements selected from the group consisting of said semiconductor switch, said short circuit-proof bypass and said wakeup circuit being controllable by a control unit.

6. A semiconductor fuse as defined in claim 5, wherein at least one of said elements selected from the group consisting of said semiconductor switch, said short circuit-proofed bypass and said wakeup circuit is controllable by the control unit which is an external control unit with a microcomputer.

7. A semiconductor fuse as defined in claim 5, wherein at least one of said elements selected from the group consisting of said semiconductor switch, said short circuit-proofed bypass and said wakeup circuit is controllable by the control unit which is a control unit of an internal combustion engine.

8. A semiconductor fuse as defined in claim 5, wherein said semiconductor switch has current measuring means connectable to the control unit so that the control unit switches off said semiconductor switch if a current detected falls below or exceeds a predeterminable value.

* * * * *